United States Patent
Good et al.

(10) Patent No.: US 10,754,319 B1
(45) Date of Patent: Aug. 25, 2020

(54) ACROSS-WAFER PROFILE CONTROL IN SEMICONDUCTOR PROCESSES

(71) Applicant: GLOBALFOUNDRIES Inc., Grand Cayman (KY)

(72) Inventors: Richard Good, Saratoga Springs, NY (US); Dinesh Balasubra Manian, Clifton Park, NY (US); Houssam Lazkani, Ballston Spa, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/551,038

(22) Filed: Aug. 26, 2019

(51) Int. Cl.
| | |
|---|---|
| *G06F 17/50* | (2006.01) |
| *H01L 21/00* | (2006.01) |
| *G05B 19/00* | (2006.01) |
| *G05B 19/18* | (2006.01) |
| *H01L 21/67* | (2006.01) |
| *G06F 30/39* | (2020.01) |
| *G06F 30/20* | (2020.01) |

(52) U.S. Cl.
CPC ........... *G05B 19/188* (2013.01); *G06F 30/39* (2020.01); *H01L 21/67011* (2013.01); *G05B 2219/2602* (2013.01); *G05B 2219/45031* (2013.01); *G06F 30/20* (2020.01)

(58) Field of Classification Search
CPC ...... G06F 30/39; G06F 30/20; G06F 2219/18; G05B 19/188; G05B 2219/2602; G05B 2219/4531; H01L 21/67011
USPC ......... 716/54, 51; 703/2; 700/103, 109, 120, 700/121
See application file for complete search history.

(56) References Cited

U.S. PATENT DOCUMENTS

| | | | | |
|---|---|---|---|---|
| 6,643,596 | B2 * | 11/2003 | Firth | ................... G03F 7/70558 700/109 |
| 6,697,771 | B1 * | 2/2004 | Kondo | .................... H01L 22/20 703/2 |
| 2003/0033043 | A1 * | 2/2003 | Wu | ........................ H01L 22/20 700/109 |
| 2003/0115005 | A1 * | 6/2003 | Firth | ................... G03F 7/70558 702/84 |

(Continued)

OTHER PUBLICATIONS

Hong et al., Chinese Patent Document No. TW-200944971, published Nov. 1, 2009, abstract and 1 drawing. (Year: 2009).*

(Continued)

*Primary Examiner* — Phallaka Kik
(74) *Attorney, Agent, or Firm* — Thompson Hine LLP; Francois Pagette

(57) ABSTRACT

Methods of controlling an across-wafer profile of a semiconductor process, as well as related systems and computer program products. A target profile of a semiconductor process over a radius of a wafer is fit to a polynomial. A plurality of gain matrices between a first plurality of process inputs and a plurality of polynomial coefficients of the polynomial are determined. An offset is estimated between the plurality of polynomial coefficients and an effect of the first plurality of process inputs. An objective function is defined as an integral of a squared deviation between an estimated profile and the target profile over the radius of the wafer. A second plurality of process inputs are mapped to the objective function by vector convolution using the plurality of gain matrices. The objective function is solved to optimize the second plurality of process inputs.

20 Claims, 2 Drawing Sheets

(56) References Cited

U.S. PATENT DOCUMENTS

| | | | |
|---|---|---|---|
| 2004/0249592 A1* | 12/2004 | Koukol, Jr. | G01F 25/00 702/88 |
| 2006/0123074 A1* | 6/2006 | Gurumurthy | G06F 17/175 708/270 |
| 2007/0106966 A1* | 5/2007 | Inoue | G06F 30/367 716/111 |
| 2010/0081219 A1* | 4/2010 | Tanaka | H01L 22/20 438/17 |
| 2013/0071957 A1* | 3/2013 | Wang | H01L 22/20 438/17 |
| 2015/0033201 A1* | 1/2015 | Vaid | H01L 22/00 716/135 |
| 2016/0187680 A1* | 6/2016 | Chen | G02F 1/1309 445/3 |
| 2016/0378094 A1* | 12/2016 | Chen | G05B 19/41875 700/109 |
| 2020/0004911 A1* | 1/2020 | Kim | G06F 30/20 |

OTHER PUBLICATIONS

X. Wang, S. Wu and K. Wang, "A Run-to-Run Profile Control Algorithm for Improving the Flatness of Nano-Scale Products," in IEEE Transactions on Automation Science and Engineering, vol. 12, No. 1, pp. 192-203, Jan. 2015.

Jingang Yi, Ye Sheng and C. S. Xu, "Neural network based uniformity profile control of linear chemical-mechanical planarization," in IEEE Transactions on Semiconductor Manufacturing, vol. 16, No. 4, pp. 609-620, Nov. 2003.

S. W. Butler and J. A. Stefani, "Supervisory run-to-run control of polysilicon gate etch using in situ ellipsometry," in IEEE Transactions on Semiconductor Manufacturing, vol. 7, No. 2, pp. 193-201, May 1994.

R. Guo and E. Sachs, "Modeling, optimization and control of spatial uniformity in manufacturing processes," in IEEE Transactions on Semiconductor Manufacturing, vol. 6, No. 1, pp. 41-57, Feb. 1993.

* cited by examiner

ACROSS-WAFER PROFILE CONTROL IN SEMICONDUCTOR PROCESSES

BACKGROUND

The present invention relates to semiconductor device fabrication and integrated circuits and, more specifically, to methods of controlling an across-wafer profile of a semiconductor process, as well as related systems and computer program products.

Across-wafer non-uniformity is a significant source of inline variability during semiconductor manufacturing at a foundry. Each wafer may be subjected to hundreds of discrete process steps over several weeks, and each process step should be satisfactorily controlled. Conventional profile control approach may fail to provide optimal, or even acceptable, across-wafer profile control for a semiconductor process. An inability to accurately control an across-wafer profile of a semiconductor process may prove expensive due to lost capacity resulting from system downtime, scrapped wafers, and test and quality assurance activities. As device size shrinks, the margin for error during a semiconductor process becomes smaller.

Improved methods of controlling an across-wafer profile during a semiconductor process, as well as related systems and computer program products, are needed.

SUMMARY

In an embodiment of the invention, a method includes fitting, by a processor, a target profile of a semiconductor process over a radius of a wafer to a polynomial, determining, by the processor, a plurality of gain matrices between a first plurality of process inputs and a plurality of polynomial coefficients of the polynomial, and estimating, by the processor, an offset between the plurality of polynomial coefficients and an effect of the first plurality of process inputs. The method further includes defining, by the processor, an objective function as an integral of a squared deviation between an estimated profile and the target profile over the radius of the wafer, mapping, by the processor, a second plurality of process inputs to the objective function by vector convolution using the plurality of gain matrices, and solving, by the processor, the objective function to optimize the second plurality of process inputs.

In an embodiment of the invention, a system includes one or more processors and a memory coupled with the one or more processors. The memory includes instructions that, when executed by the one or more processors, cause the system to fit a target profile of a semiconductor process over a radius of a wafer to a polynomial, determine a plurality of gain matrices between a first plurality of process inputs and a plurality of polynomial coefficients of the polynomial, estimate an offset between the plurality of polynomial coefficients and an effect of the first plurality of process inputs, define an objective function as an integral of a squared deviation between an estimated profile and the target profile over the radius of the wafer, map a second plurality of process inputs to the objective function by vector convolution using the plurality of gain matrices, and solve the objective function to optimize the second plurality of process inputs.

In an embodiment, a computer program product includes program code stored on a non-transitory computer-readable storage medium that, when executed by one or more processors, causes the one or more processors to determine a plurality of gain matrices between a first plurality of process inputs and a plurality of polynomial coefficients of the polynomial, estimate an offset between the plurality of polynomial coefficients and an effect of the first plurality of process inputs, define an objective function as an integral of a squared deviation between an estimated profile and the target profile over the radius of the wafer, map a second plurality of process inputs to the objective function by vector convolution using the plurality of gain matrices, and solve the objective function to optimize the second plurality of process inputs.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
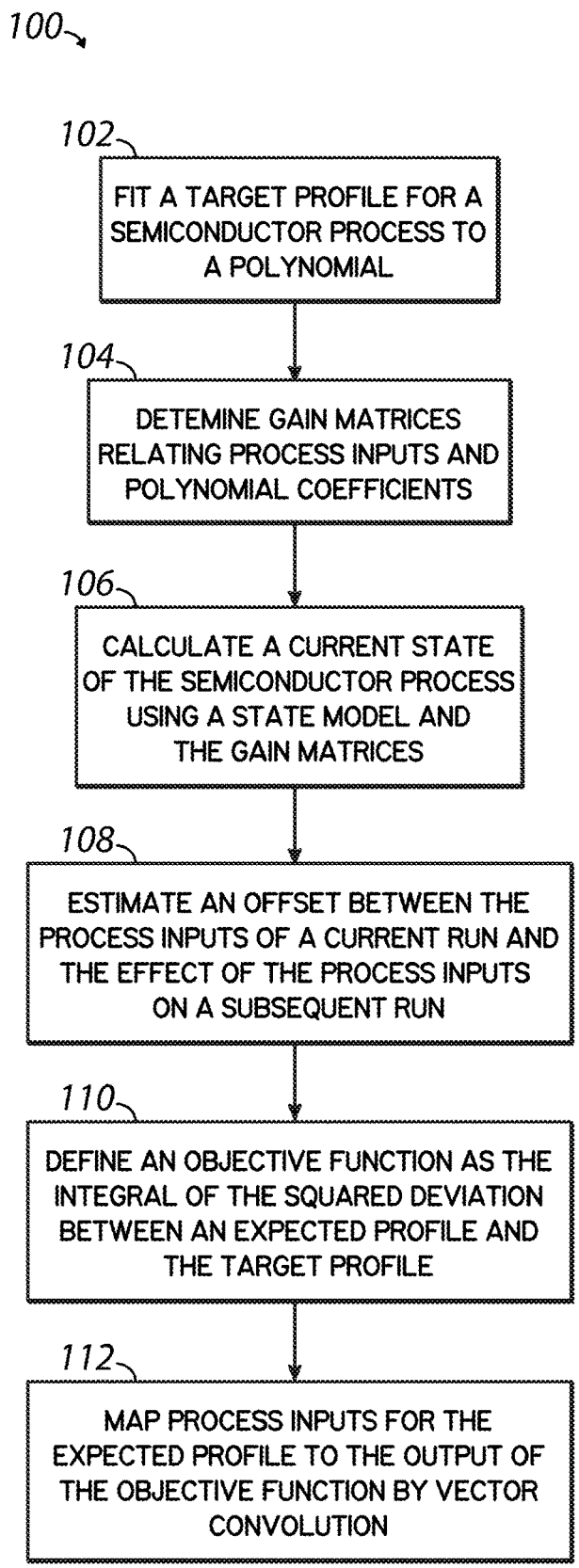
FIG. 1 is a flowchart illustrating a sequence of operations that can be performed by a computer system to determine process inputs for controlling an across-wafer profile of a semiconductor process.
Figure 2:
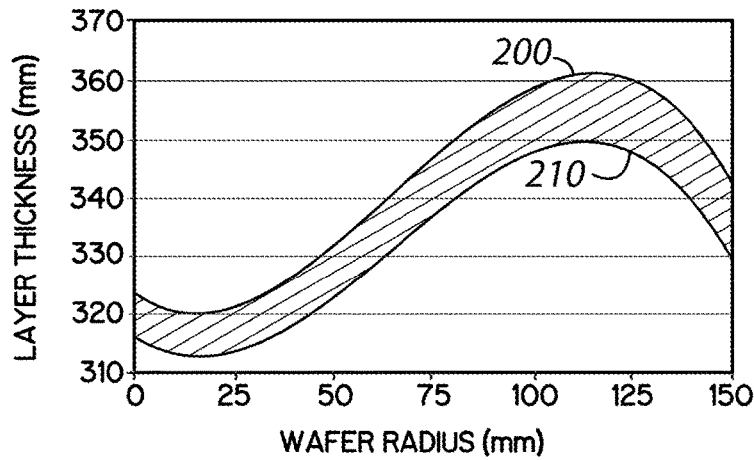
FIG. 2 is a chart illustrating a target profile and an expected profile for a semiconductor process.

With reference to FIGS. 1, 2 and in accordance with embodiments of the invention, a method 100 of determining process inputs for controlling an across-wafer profile of a semiconductor process is provided. In block 102, a target profile 200 for the semiconductor process is provided. The target profile 200 describes an across-wafer profile as a function of radial position from the wafer center of a parameter subject to uniformity control. In an embodiment, the target profile 200 may describe an across-wafer profile as a function of radial position from the wafer center for the thickness of a deposited or grown layer of material, such as an epitaxially-grown layer of semiconductor material (e.g., epitaxially grown silicon). Although the subsequent description is based on thickness of an epitaxially-grown layer, it is understood that the subsequent description applies to other parameters. The shape of the target profile 200 is described by a curve, and the curve may be empirically determined.

The target profile 200 may be characterized mathematically by fitting a polynomial of a given order to the shape of the curve using a polynomial regression model. The coefficients of the polynomial may represent a set of target coefficients describing the outcome from fitting the target profile 200 under a given set of process inputs. In an embodiment, each polynomial may be a cubic or third-order polynomial:

$$y_T = a_3 r^3 + a_2 r^2 + a_1 r + a_0 \quad (1)$$

where $y_T$ is the fitted polynomial representing the target profile, $a_3, a_2, a_1$ are coefficients of the fitted polynomial, $a_0$ is the y-intercept of the fitted polynomial, and r is the radial position on the wafer.

In block 104, gain matrices may be determined that relate the different process inputs and their polynomial coefficients. To that end, a design of experiment analysis may be performed in which the effects of process input variations on the semiconductor process can be systematically assessed. The design of experiment analysis is aimed to explain the variation of the target profile based on process inputs (i.e., independent variables). To that end, the semiconductor process under analysis may be executed for a given run of a wafer lot with systematic variations in the process inputs and the resulting profiles may be measured. For example, the designed experiments may epitaxially grow a semiconductor layer on a wafer resulting from a vector of different process inputs (e.g., temperature, applied power, pressure, gas flows, etc.) for the epitaxial-growth tool, and across-wafer measurements of the thickness may be made to provide experimental data. Each designed experiment may vary one of the process inputs while holding other process inputs constant.

The data (e.g., thickness data) from each of the measured profiles may be fitted to a polynomial with polynomial coefficients that vary according to the particular process inputs chosen for the designed experiment. For example, the polynomial coefficients from the measured profiles may be associated with a third-order polynomial (Eqn. 1).

The gain matrices are determined using the polynomial coefficients from the designed experiments. Each vector of polynomial coefficients in the gain matrix describes the effect of one of the process inputs on the polynomial coefficients.

In alternative embodiments, the gain matrices may be determined based on historical process data or other process knowledge relating to the semiconductor process under analysis.

In block 106, a state of the semiconductor process during the designed experiments of the current run at time t (i.e., run t) is calculated using a state model and the gain matrices. In an embodiment, the state model may be expressed as:

$$a_t = bu_t + c_t \quad (2)$$

where $a_t$ are vectors of polynomial coefficients measured at the given run, b is the gain matrix, $u_t$ are vectors of process inputs used by the process at given run, and $c_t$ are vectors of intercept states at the given run. The vectors of intercept states are the unknown quantities determined by the state calculation.

In block 108, a state estimation algorithm (i.e., an observer) may be used to estimate an offset between the process inputs at the given run and the effect of the inputs on a subsequent run (e.g., the next run). A state model may be used to determine the vector of process inputs, $u_{t+1}$, for the next run (i.e., a run to be performed at time t+1) of a wafer lot. The state model for the next run may be expressed as:

$$\hat{a}_{t+1} = bu_{t+1} + \hat{c}_{t+1} \quad (3)$$

where $\hat{a}_{t+1}$ is an estimated vector of polynomial coefficients at the next run, b is the gain matrix, $u_{t+1}$ are vectors of process inputs to be used by the process for the next run, and $\hat{c}_{t+1}$ are estimated vectors of intercept states at the next run. The vectors of polynomial coefficients may be, for example, the same vectors of polynomial coefficients as applied during the previous run as an estimate.

The estimated vectors of intercepts $\hat{c}_{t+1}$ may be calculated using a state-estimation algorithm that considers known intercept vectors that were calculated from past runs involving the same semiconductor process. In an embodiment, the estimated vectors of intercepts $\hat{c}_{t+1}$ may be calculated from an Exponentially Weighted Moving Average (EWMA) that averages the intercepts in a way that gives progressively decreasing weight to past intercept vectors that are further removed in time. For example, the estimated vector of intercepts may be determined using EWMA from the most-recently calculated vector of intercept states $c_t$ from run t and one or more past vectors of intercept states (e.g., $c_{t-1}$ at run t-1, $c_{t-2}$ at run t-2, etc.). In an alternative embodiment, the state-estimation algorithm may be a Kalman filter algorithm that estimates the intercept vectors by estimating a joint probability distribution for each of the multiple time-frames.

In block 110, an expected profile 210 for the semiconductor process is optimized by additional calculations before performing the next run. The additional calculations choose process inputs such that the sum of the squared deviation (i.e., distance) between the expected profile 210 and the target profile 200 is minimized. An objective function is defined as the integral of the squared deviation or distance between the expected profile 210 and the target profile 200 integrated over the radius of the wafer. The objective function may be expressed as:

$$\min_u j = \int_0^{r2} (y_T - \hat{y})^2 dr \quad (4)$$

where r2 is the wafer radius (e.g., 150 mm), $y_t$ is the fitted polynomial representing the target profile 200, and $\hat{y}$ is the fitted polynomial representing the expected profile 210. The objective function is used to determine a minimum area for the deviation between the fitted curve of the expected profile 210 and the fitted curve of the target profile 200.

In an embodiment, the fitted polynomial representing the expected profile for the semiconductor process may be expressed by:

$$\hat{y} = \hat{a}_3 r^3 + \hat{a}_2 r^2 + \hat{a}_1 r + \hat{a}_0 \quad (5)$$

where $\hat{a}_3$, $\hat{a}_2$, and $\hat{a}_1$ are estimated polynomial coefficients, $\hat{a}_0$ is the estimated y-intercept, and r is the radial position on the wafer.

In an embodiment, the fitted polynomial representing the target profile for the semiconductor process may be expressed by:

$$y_T = a_{T,3} r^3 + a_{T,2} r^2 + a_{T,1} r + a_{T,0} \quad (6)$$

where $a_{T,3}$, $a_{T,2}$, and $a_{T,1}$ are polynomial coefficients, $a_{T,0}$ is the y-intercept, and r is the radial position on the wafer.

In block 112, vector convolution may be used to map process inputs for the expected profile to the objective function. Vector convolution, which is mathematically equivalent to multiplying polynomials, represents a simplified mathematical operation in comparison with brute-force integration. The vector convolution may be used to express the quadratic component of Eqn. (4) in terms of a matrix, $D_{i,j}$, as:

$$D_{i,j} = (b_i \circledast b_j)\rho \quad (7)$$

where $b_i$ and $b_j$ are the different gain matrices and p is a vector related to radial position.

The linear component of Eqn. (4) may be a vector, $f_i$, expressed by vector convolution as:

$$f_i = ((a_T - \hat{c}) \circledast b_i)\rho \quad (8)$$

The vector ρ may be expressed as:

$$\rho = \begin{bmatrix} \dfrac{r_2^{2n+1}}{2n+1} & \dfrac{r_2^{2n}}{2n} & \dfrac{r_2^{2n-1}}{2n-1} & \cdots & r_2 \end{bmatrix} \quad (9)$$

where n is the order of the polynomial and $r_2$ is the radial position on the wafer.

For a third-order polynomial, the vector ρ may be expressed as:

$$\rho = \begin{bmatrix} \dfrac{r_2^7}{7} & \dfrac{r_2^6}{6} & \dfrac{r_2^5}{5} & \cdots & \dfrac{r_2^1}{1} \end{bmatrix} \quad (10)$$

In block 114, the objective function in Eqn. 4 is solved to determine a vector of optimal process inputs for the semiconductor process. In an embodiment, the objective function may be solved to determine a vector of optimal process inputs using matrix inversion. To that end, the objective function in Eqn. 4 may be expressed in terms of matrix, $D_{i,j}$, and vector, $f_i$, as:

$$\min_u j = u^T D u - 2 f^T u \quad (11)$$

where u is the vector of process inputs, $u^T$ is the transpose of the vector of process inputs, D is the matrix, $D_{i,j}$, and $f^T$ is the transpose of the vector, $f_i$.

The expression for the objective function may be simplified by replacing 2D with Q:

$$\min_u j = \tfrac{1}{2} u^T Q u - 2 f^T u \quad (12)$$

To minimize the objective function, the derivative is taken and set equal to zero.

$$\frac{dj}{du} = Qu - 2f = 0 \quad (13)$$

The process inputs for the best expected profile are determined by solving Eqn. 13 for the optimum vector for the process inputs u, namely the vector of optimized process inputs, u*,:

$$u^* = 2Q^{-1}f \quad (14)$$

In alternative embodiments, the objective function may be solved using pseudo-inversion, weighted optimization, and/or constrained optimization.

Figure 3:
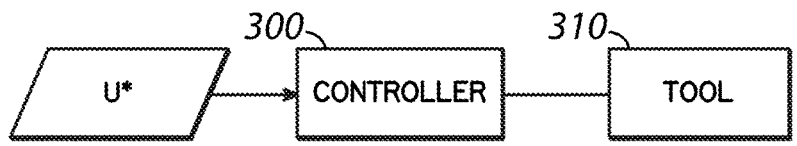
FIG. 3 is a diagrammatic view of a controller controlling a process tool based on a set of optimized process inputs.

As shown in FIG. 3, the vector of optimized process inputs is provided to a controller 300 interfaced with a process tool 310. The controller 300, which may be a run-to-run controller, uses the vector of optimized process inputs to control the semiconductor process performed by the process tool 310. For example, the process tool 310 being controlled may be used to deposit or grow a layer of material, such as an epitaxially-grown layer of semiconductor material (e.g., epitaxially grown silicon), during a run processing a lot of wafers.

In alternative embodiments, a vector R may be included in the objective function to penalize movement of the process inputs too far away from nominal values, $u_0$, which may be expressed as:

$$(u - u_0)^T R (u - u_0) \quad (15)$$

In alternative embodiments, a vector S may be included in the objective function to penalize changing the process inputs from the previous values, $u_t$, which may be expressed as:

$$(u - u_t)^T S (u - u_t) \quad (16)$$

If both vectors R and S are included, the objective function becomes:

$$\min_u j = \tfrac{1}{2} u^T (Q + 2R + 2S) u - 2(f^T + u_0^T R + u_t^T S) u \quad (17)$$

To minimize the objective function, the derivative is taken and set equal to zero.

$$\frac{dj}{du} = (Q + 2R + 2S) u - 2(f^T + u_0^T R + u_t^T S) = 0 \quad (18)$$

The process inputs for the best expected profile are determined by solving Eqn. 17, with matrix inversion, for the optimum vector for u, namely u*,:

$$u^* = 2(Q + 2R + 2S)^{-1}(f^T + u_0^T R + u_t^T S) \quad (19)$$

In alternative embodiments, the process inputs embedded in the objective function of Eqn. 12 or Eqn. 16 may also be constrained to fall within absolute limits (i.e., lower limits and upper limits).

$$u \geq u_{LL}$$
$$u \leq u_{UL} \quad (20)$$

The process inputs embedded in the objective function of Eqn. 12 or Eqn. 16 may also be constrained to fall within rate of change limits (i.e., negative rate of change limits and positive rate of change limits).

$$u - u_t \geq -u_{ROC}$$
$$u - u_t \leq u_{ROC} \quad (21)$$

Across-wafer uniformity of a semiconductor process may be improved by controlling the semiconductor process based on the integral of the squared deviation between an expected profile and a target profile. Vector convolution may be used as a simplifying analytical tool to map the process inputs for a process tool providing the semiconductor process to the objective function.

The algorithm for determining process inputs to control the across-wafer profile of a semiconductor process may be implemented by a run-to-run controller. To that end, the process inputs may represent the control settings (i.e., recipe) for the semiconductor process, and the recipe for the semiconductor process may be updated through the algorithm to compensate for time-dependent shifts or drifts in process inputs.

Figure 4:
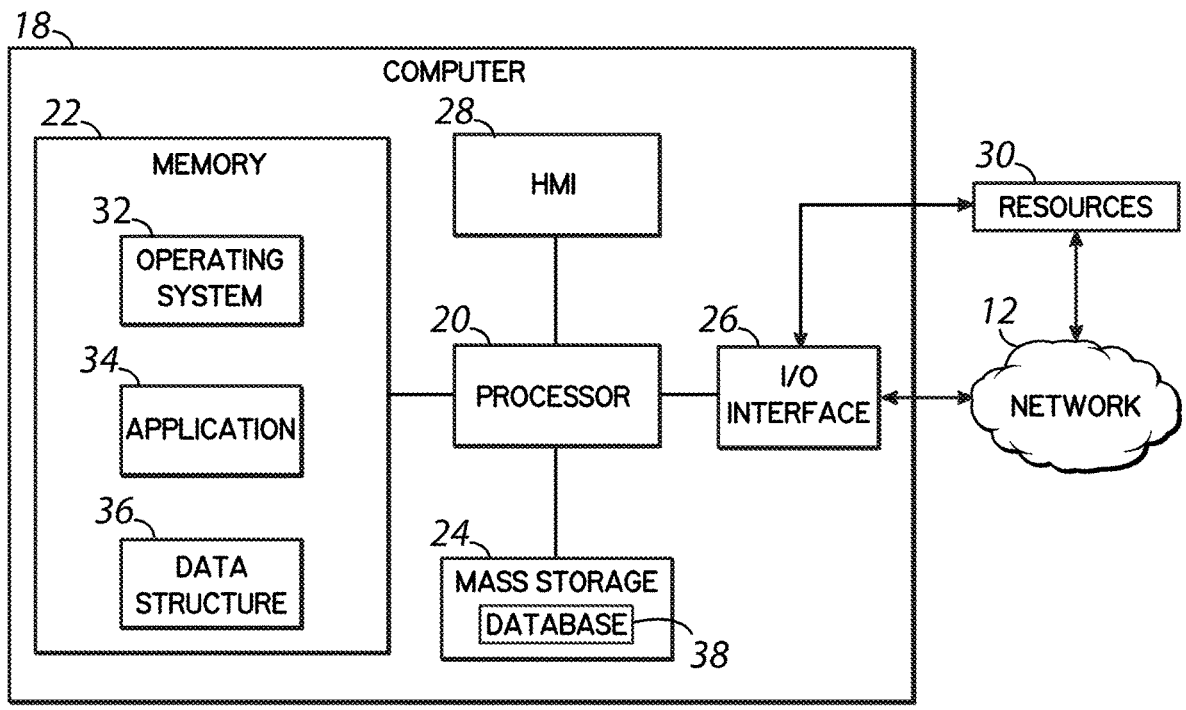
FIG. 4 is a schematic view of an exemplary computer system that may be used to perform the sequence of operations in the flowchart of FIG. 1.

With reference to FIG. 4, the controller 300 may be implemented on one or more computer devices or systems, such as exemplary computer system 18, in order to enable the methods for controlling the across-wafer profile of the semiconductor process. The computer system 18 may include a processor 20, a memory 22, a mass storage memory device 24, an input/output (I/O) interface 26, and a Human Machine Interface (HMI) 28. The computer system 18 may also be operatively coupled to one or more external resources 30 via the I/O interface 26. External resources 30 may include, but are not limited to, servers, databases, mass storage devices, peripheral devices, cloud-based network services, or any other suitable computer resource that may be used by the computer system 18.

The processor 20 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 22. The memory 22 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing information. The mass storage memory device 24 may include data storage devices such as a hard drive, optical drive, tape drive, non-volatile solid state device, or any other device capable of storing information.

The processor 20 may operate under the control of an operating system 32 that resides in the memory 22. The operating system 32 may manage computer resources so that computer program code embodied as one or more computer software applications, such as an application 34 residing in memory 22, may have instructions executed by the processor 20. In an alternative embodiment, the processor 20 may execute the application 34 directly, in which case the operating system 32 may be omitted. One or more data structures 36 may also reside in memory 22, and may be used by the processor 20, operating system 32, or application 34 to store or manipulate data. The application 34 may include instructions for determining process inputs for controlling an across-wafer profile of a semiconductor process as described herein.

The I/O interface 26 may provide a machine interface that operatively couples the processor 20 to other devices and systems, such as one or more external resources 30 or a communications network. The application 34 may thereby work cooperatively with the external resources 30 by communicating via the I/O interface 26 to provide the various features, functions, applications, processes, or modules comprising embodiments of the invention. The application 34 may also have program code that is executed by the one or more external resources 30, or otherwise rely on functions or signals provided by other system or network components external to the computer system 18. Indeed, given the nearly endless hardware and software configurations possible, persons having ordinary skill in the art will understand that embodiments of the invention may include applications that are located externally to the computer system 18, distributed among multiple computers or other external resources 30, or provided by computing resources (hardware and software) that are provided as a service over a communication network, such as a cloud computing service.

The HMI 28 may be operatively coupled to the processor 20 of computer system 18 in a known manner to allow a user to interact directly with the computer system 18. The HMI 28 may include video or alphanumeric displays, a touch screen, a speaker, and any other suitable audio and visual indicators capable of providing data to the user. The HMI 28 may also include input devices and controls such as an alphanumeric keyboard, a pointing device, keypads, push-buttons, control knobs, microphones, etc., capable of accepting commands or input from the user and transmitting the entered input to the processor 20.

A database 38 may reside on the mass storage memory device 24, and may be used to collect and organize data used by the various systems and modules described herein. The database 38 may include data and supporting data structures that store and organize the data. In particular, the database 38 may be arranged with any database organization or structure including, but not limited to, a relational database, a hierarchical database, a network database, or combinations thereof. A database management system in the form of a computer software application executing as instructions on the processor 20 may be used to access the information or data stored in records of the database 38 in response to a query, where a query may be dynamically determined and executed by the operating system 32, other applications 34, or one or more modules.

In general, the routines executed to implement the embodiments of the invention, whether implemented as part of an operating system or a specific application, component, program, object, module or sequence of instructions, or even a subset thereof, may be referred to herein as "computer program code," or simply "program code." Program code typically comprises computer readable instructions that are resident at various times in various memory and storage devices in a computer and that, when read and executed by one or more processors in a computer, cause that computer to perform the operations necessary to execute operations and/or elements embodying the various aspects of the embodiments of the invention. Computer readable program instructions for carrying out operations of the embodiments of the invention may be, for example, assembly language or either source code or object code written in any combination of one or more programming languages.

The program code embodied in any of the applications/modules described herein is capable of being individually or collectively distributed as a program product in a variety of different forms. In particular, the program code may be distributed using a computer readable storage medium having computer readable program instructions thereon for causing a processor to carry out aspects of the embodiments of the invention.

Computer readable storage media, which are inherently non-transitory, may include volatile and non-volatile, and removable and non-removable tangible media implemented in any method or technology for storage of information, such as computer-readable instructions, data structures, program modules, or other data. Computer readable storage media may further include random access memory (RAM), read-only memory (ROM), erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. A computer readable storage medium should not be construed as transitory signals per se (e.g., radio waves or other propagating electromagnetic waves, electromagnetic waves propagating through a transmission media such as a waveguide, or electrical signals transmitted through a wire). Computer readable program instructions may be downloaded to a computer, another type of programmable data processing apparatus, or another device from a computer readable storage medium or to an external computer or external storage device via a communication network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions/acts specified in the flowcharts, sequence diagrams, and/or block diagrams. The computer program instructions may be provided to one or more processors of a general purpose computer, special purpose computer, or other programmable data processing apparatus to produce a machine, such that the instructions, which execute via the one or more processors, cause a series of computations to be performed to implement the functions and/or acts specified in the flowcharts, sequence diagrams, and/or block diagrams.

In certain alternative embodiments, the functions and/or acts specified in the flowcharts, sequence diagrams, and/or block diagrams may be re-ordered, processed serially, and/or processed concurrently without departing from the scope of the invention. Moreover, any of the flowcharts, sequence diagrams, and/or block diagrams may include more or fewer blocks than those illustrated consistent with embodiments of the invention.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   fitting a target profile of a semiconductor process over a radius of a wafer to a polynomial;
   determining a plurality of gain matrices between a first plurality of process inputs and a plurality of polynomial coefficients of the polynomial;
   estimating an offset between the plurality of polynomial coefficients and an effect of the first plurality of process inputs;
   defining an objective function as an integral of a squared deviation between an estimated profile and the target profile over the radius of the wafer;
   mapping a second plurality of process inputs to the objective function by vector convolution using the plurality of gain matrices; and
   solving the objective function to optimize the second plurality of process inputs.

2. The method of claim 1 wherein the polynomial is a third-order polynomial.

3. The method of claim 1 wherein the plurality of gain matrices are determined using a plurality of designed experiments.

4. The method of claim 1 wherein the plurality of gain matrices are determined using historical process data.

5. The method of claim 1 wherein the offset between the plurality of polynomial coefficients and the effect of the first plurality of process inputs is estimated using a state estimation algorithm.

6. The method of claim 1 wherein the objective function is solved using matrix inversion.

7. The method of claim 1 further comprising:
   adding limits for the second plurality of process inputs when the objective function is optimized.

8. The method of claim 1 further comprising:
   adding a constraint when the objective function is optimized.

9. The method of claim 1 further comprising:
   providing the second plurality of process inputs to a controller of a process tool,
   wherein the controller uses the second plurality of process inputs to control the semiconductor process performed by the process tool.

10. A system comprising:
    one or more processors; and
    a memory coupled with the one or more processors, the memory including instructions that, when executed by the one or more processors, cause the system to:
    fit a target profile of a semiconductor process over a radius of a wafer to a polynomial;

determine a plurality of gain matrices between a first plurality of process inputs and a plurality of polynomial coefficients of the polynomial;

estimate an offset between the plurality of polynomial coefficients and an effect of the first plurality of process inputs;

define an objective function as an integral of a squared deviation between an estimated profile and the target profile over the radius of the wafer;

map a second plurality of process inputs to the objective function by vector convolution using the plurality of gain matrices; and solve the objective function to optimize the second plurality of process inputs.

11. The system of claim 10 wherein the polynomial is a third-order polynomial.

12. The system of claim 10 wherein the plurality of gain matrices are determined using a plurality of designed experiments.

13. The system of claim 10 wherein the plurality of gain matrices are determined using historical process data.

14. The system of claim 10 wherein the offset between the plurality of polynomial coefficients and the effect of the first plurality of process inputs is estimated using a state estimation algorithm.

15. The system of claim 10 wherein the objective function is solved using matrix inversion.

16. The system of claim 10 further comprising:
adding limits for the second plurality of process inputs when the objective function is optimized.

17. The system of claim 10 further comprising:
adding a constraint when the objective function is optimized.

18. The system of claim 10 further comprising:
providing the second plurality of process inputs to a controller of a process tool,
wherein the controller uses the second plurality of process inputs to control the semiconductor process performed by the process tool.

19. A computer program product comprising:
a non-transitory computer-readable storage medium; and
program code stored on the non-transitory computer-readable storage medium that, when executed by one or more processors, causes the one or more processors to:

fit a target profile of a semiconductor process over a radius of a wafer to a polynomial;

determine a plurality of gain matrices between a first plurality of process inputs and a plurality of polynomial coefficients of the polynomial;

estimate an offset between the plurality of polynomial coefficients and an effect of the first plurality of process inputs;

define an objective function as an integral of a squared deviation between an estimated profile and the target profile over the radius of the wafer;

map a second plurality of process inputs to the objective function by vector convolution using the plurality of gain matrices; and solve the objective function to optimize the second plurality of process inputs.

20. The computer program product of claim 19 wherein the polynomial is a third-order polynomial, the plurality of gain matrices are determined using a plurality of designed experiments, and the objective function is solved using matrix inversion.

* * * * *